United States Patent
Igel

[19]

[11] Patent Number: 5,885,897
[45] Date of Patent: Mar. 23, 1999

[54] PROCESS FOR MAKING CONTACT TO DIFFERENTLY DOPED REGIONS IN A SEMICONDUCTOR DEVICE, AND SEMICONDUCTOR DEVICE

[75] Inventor: Gunter Igel, Teningen, Germany

[73] Assignee: Deutsche ITT Industries GmbH, Freiburg, Germany

[21] Appl. No.: 781,457

[22] Filed: Jan. 10, 1997

[30] Foreign Application Priority Data

Jan. 11, 1996 [DE] Germany ............... 196 00 780.1

[51] Int. Cl.$^6$ ............................................ H01L 21/44
[52] U.S. Cl. .................... 438/656; 438/666; 438/660
[58] Field of Search ............................. 438/656, 658, 438/660–661, 666

[56] References Cited

U.S. PATENT DOCUMENTS

| | | | |
|---|---|---|---|
| 2,858,489 | 10/1958 | Henkels | 438/661 |
| 3,290,565 | 12/1966 | Hastings | 438/656 |
| 3,351,825 | 11/1967 | Vidas | 438/658 |
| 4,879,254 | 11/1989 | Tsuzuki et al. | |
| 4,902,636 | 2/1990 | Akiyama et al. | |
| 5,171,705 | 12/1992 | Choy | |
| 5,223,455 | 6/1993 | Itoh et al. | 438/656 |
| 5,225,040 | 7/1993 | Rohner | 438/656 |
| 5,298,784 | 3/1994 | Gambino et al. | |
| 5,302,537 | 4/1994 | Strack | |
| 5,306,654 | 4/1994 | Kometani | |
| 5,407,857 | 4/1995 | Higuchi | 438/658 |

FOREIGN PATENT DOCUMENTS

| | | |
|---|---|---|
| 0113522 | 7/1984 | European Pat. Off. |
| 3240162 | 7/1983 | Germany |
| 3634982 | 4/1988 | Germany |

OTHER PUBLICATIONS

T.G. Finstad, et al., "Interaction of Evaporated Palladium and Titanium Films wigh Single–Crystal Silicon", Thin Solid Films, vol. 68, pp. 393–405, 1980.

F.F. Fang, et al., "Mettallurgical System for Silicon Metal Semiconductor Field–Effect Transistor LSI", IMB Technical Disclosure Bulletin, vol. 24, No. 10, Mar. 1982.

M. Bartur, et al., "Thermal Oxidation of Transition Metal Silicides on Si:Summary", J. Electrochem Soc., pp. 371–375, Feb. 1984.

Patent Abstract of Japan, vol. 10, No. 113 (E–399), 26. Apr. 1986 & JP 60 249370 10. Dec. 1985.

J.H. Thomas, "An X–Ray Photoelectron Spectroscopy. Auger Electron Spectroscopy Study of Titanium–Palladium Thin Films on Silicon (111)", J. Vac. Sci. Technol. A 5 (4), Jul./Aug. 1987.

G. Chen, et al., "A Novel Contact Process for Power MOSFET's", IEEE Electron Device Letters, vol. EDL–7, No. 12, Dec. 1986.

Patent Abstract of Japan, vol. 013, No. 232 (E–765), 29. May 1989 & JP 01 039775 A 10. Feb. 1989.

Krishna Shenai, et al., High Performance Vertical–Power MOSFET's with Selectively Silicide Gate and Source Regions, IEEE Electron Letters, vol. 10, No. 4, Apr. 1987.

(List continued on next page.)

*Primary Examiner*—Richard A. Booth
*Attorney, Agent, or Firm*—Plevy & Associates

[57] ABSTRACT

A process is disclosed for making contact to differently doped regions in a semiconductor device which are disposed in a silicon substrate in different depths, a first region with a first dopant concentration and/or conductivity type and the smaller depth being disposed in a second region with a second dopant concentration and/or conductivity type and the greater depth, and a first metal layer being deposited on the first region. A second metal layer is deposited on a portion of the first metal layer, and the structure is subjected to a heat treatment in which contact is made to the first region through the first metal layer and to the second region through the first metal layer and the second metal layer.

15 Claims, 1 Drawing Sheet

OTHER PUBLICATIONS

Chin–An Chang, "Thermal Stability of the CU/Pd/Si Mettalurgy", Appl. Phys. LEtt. 55 (15), 9 Oct. 1989.

Krishna Shenai, "Effect of P–Based Sheet and Contact Resistance on Static Current–Voltage Vertical Power DMOSFET's", IEEE Electron Device Letters, 12 (1991) Jun., No. 6.

Mukta S. Farooq, Schottky Device Behavior of n–Si/$Pd_2$Si/Al and n–Si/$CoSi_2$/Al Contats With and With–out a $Ta_2$N Diffusion Barrier Materials Science & Engineering B, B19 (1993) Jun. 20, No. 3.

Copy of German Search Report for 196 00 780.1–33, dated 31. Jan. 1996.

Copy of European Patent Office Search of 97100389.2, dated May 1997.

PROCESS FOR MAKING CONTACT TO DIFFERENTLY DOPED REGIONS IN A SEMICONDUCTOR DEVICE, AND SEMICONDUCTOR DEVICE

FIELD OF THE INVENTION

The present invention relates to an improved process for making contact to differently doped regions of a semiconductor device where the differently doped regions are disposed in a silicon substrate at different depths, and the semiconductor device resulting from this process.

BACKGROUND OF THE INVENTION

Processes for making contact to differently doped regions in a silicon substrate of a semiconductor device where the doped regions are disposed at different depths in the silicon substrate, and the resulting semiconductor devices are well known in practice. In such processes and devices, the silicon substrate typically includes a first region with a first dopant concentration and/or conductivity type, disposed within a second region with a second dopant concentration and/or conductivity type where the second region extends farther into the silicon substrate than the more shallow first region. In order to make contact to both the regions, a metal layer is deposited on the shallow first region. Through a heat treatment process, contact is established between the shallow first region and the metal layer. To make contact to the more deeply located second region, an additional region is formed in the shallow first region. The additional region is connected to, and is of the same conductivity type as, the deeper second region. Thus, during the heat treatment, contact can also be made to the deeper second region through the metal layer. This process is used, for example, in the fabrication of DMOS transistors. In that case, the semiconductor substrate is lightly doped n-type, the deeper second region is lightly doped p-type, and the shallow first region is heavily doped n-type. To make reliable, low-resistance contact to the lightly p-type doped, second region, the contact region formed in the first region is heavily doped p-type. The formation of this heavily p-type doped region requires an additional masking step in which exact alignment is of great importance, for the position of the additional region determines the size of the remaining portions of the first region, and thus, the properties of the diode formed by this first region and the second region. Accordingly, the deposition of the additional region for making contact to the second region is a very critical step.

It is, therefore, the object of the present invention to provided an improved and simplified process for making contact to differently doped regions in a silicon substrate of a semiconductor device and a semiconductor device which results from such a process.

SUMMARY OF THE INVENTION

A process for making contact to differently doped regions in a semiconductor device which are disposed in a silicon substrate at different depths. The differently doped regions of the semiconductor device include a first region of a first predetermined depth with a first dopant concentration and a first conductivity type. The first region is disposed within a second region of a second predetermined depth which is greater than the first predetermined depth, the second region having a second dopant concentration and a second conductivity type. The process comprises the steps of depositing a first metal layer on the first region of the silicon substrate, depositing a second metal layer on a portion of the first metal layer and heat treating the semiconductor device to form a contact to the first region through the first metal layer and a contact to the second region through the first metal layer and the second metal layer.

Also described is a semiconductor device made by the above-described process wherein the portion of the first metal layer covered by the second metal layer extends down through the first region into the second region thereby forming a contact through the first and second metal layers and a portion of the first metal layer not covered by the second metal layer contacts the first region thereby forming a contact through the first metal layer.

BRIEF DESCRIPTION OF THE DRAWINGS

The invention will now be explained in more detail with reference to the accompanying drawing, in which.

DETAILED DESCRIPTION OF THE INVENTION

Figure 1:
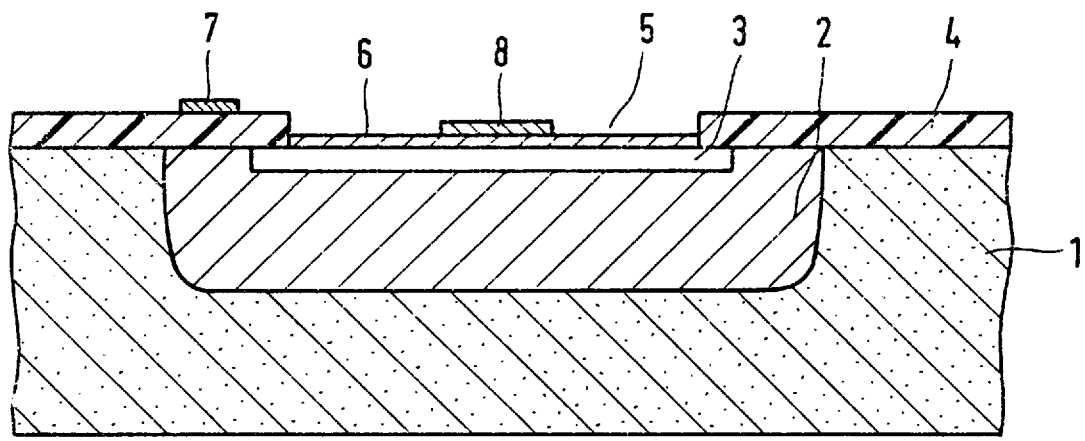
FIG. 1 is a cross section of a semiconductor device according to the invention prior to the heat treatment.

The present invention will be described using a DMOS transistor as an example. It should be understood, however, that the process and contact structure of the present invention can be used in other types of semiconductor devices that have differently doped regions of varying depths in a silicon substrate. FIG. 1 shows a cross section of a DMOS transistor prior to the heat treatment. The DMOS transistor has a silicon substrate 1. It is assumed here that the silicon substrate 1 is lightly doped n-type from which follows the doping described in the following. The substrate 1 contains a second region 2 which is lightly doped p-type. The second region contains a first region 3 of smaller depth which is heavily doped n-type. A masking layer deposited on the top surface of the silicon substrate 1 has an opening 5 in a portion of the first region 3. Within the opening 5 of the masking layer 4, a first metal layer 6 is provided on the first region 3. A gate electrode 7 is provided on the masking layer 4 above the second region 2. A portion of the first metal layer 6 is covered by a second metal layer 8.

Figure 2:
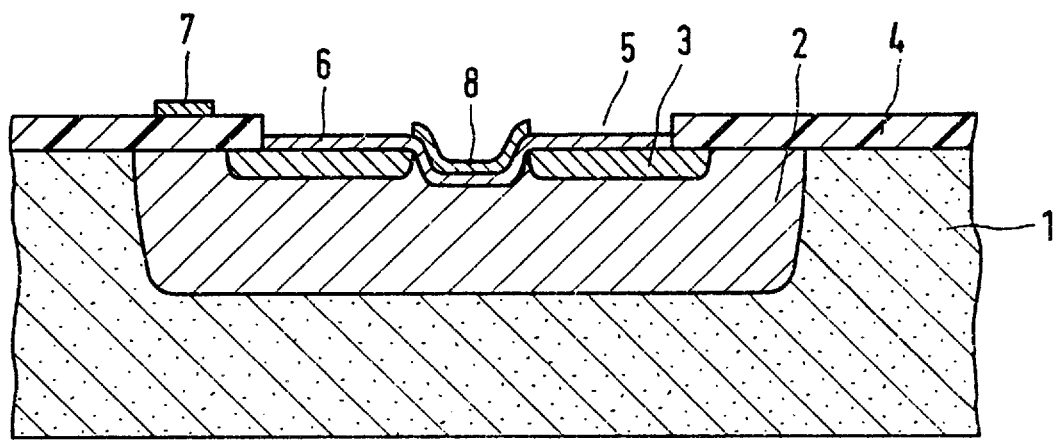
FIG. 2 shows the semiconductor device of FIG. 1 after the heat treatment.

FIG. 2 shows the same semiconductor device, a DMOS transistor, after the structure of FIG. 1 has been subjected to a heat treatment. During the heat treatment, silicon atoms are diffused from the silicon substrate 1, particularly from the first region 3, through the first metal layer 6 into the second metal layer 8. As a result, the portion of the first metal layer 6 covered by the second metal layer 8 sinks through the first region 3 into the second region 2. To make contact between the second metal layer 8 and the second region 2, this sinking must continue until the first metal layer 6 makes contact with the second region 2. Through the heat treatment, a contact is thus provided to the second region 2 through the first and second metal layers 6, 8. At the same time, a contact is made to the first region 3 through the first metal layer 6 in the area not covered by the second metal layer 8.

The structure describe above is a DMOS transistor in which the drain region is represented by the silicon substrate 1, the source region by the first region 3, and the channel, whose operation is controlled by the gate electrode 7 overlying the second region 2. In a preferred embodiment of the present invention, it is advantageous to provide the second region 2 with a low dopant concentration. Then, the contact made between the first metal layer 6, the second metal layer 8, and the second region 2 forms a Schottky diode having good forward characteristics, so that in this area the contact resistance between metal and semiconductor is insignificant. It is most desirable for the first metal layer 6 to be made of a material different from that of the second metal layer 8 where the first metal layer 6 is preferably chosen so as to have a high diffusion rate for silicon atoms and the second metal layer 8 is preferably chosen so as to have a high combining capacity for silicon atoms. Accordingly, the preferred material for the first metal layer 6 is palladium and the preferred material for the second metal layer 8 is titanium. It is also advantageous if the conductivity type of the first region 3 is opposite to that of the second region 2. This results in a further pn-junction diode in parallel with the Schottky diode. The first region 3 may have a high dopant concentration, whereby a low-resistance contact is achieved when this region is contacted through the first metal layer 6. If all the above-mentioned requirements are met and the substrate 1 is of the first conductivity type and has a low dopant concentration, and the gate electrode 7 isolated from the second region 2 is provided above the latter, the structure forms a DMOS transistor. The second region 2 and the substrate 1 with the low dopant concentrations are for example, doped to $10^{15}$ atoms/cm$^3$. The heavily doped first region 3 is for example, doped to $10^{18}$ atoms/cm$^3$. The exact choice of the dopant concentration depends on what type of semiconductor device is to be fabricated.

The details of the process for making contact to differently doped regions will now be described in greater detail with reference to the DMOS device shown in the FIG. 1. Up to the formation of the first region 3 and the second region 2 in the silicon substrate 1, the fabrication process corresponds to the process commonly used in the prior art to fabricate a DMOS device. Then a mask layer 4 is deposited over the substrate 1 and an opening 5 is created over the first region 3. The first metal layer 6 is deposited on the first region 3 in the opening 5 of the mask layer 4. Also, a gate electrode 7 is deposited on the masking layer 4. With a further masking process, a second metal layer 8 is deposited on a portion of the first metal layer 6. The masking processes are techniques familiar to those skilled in the art, such as photolithographic and etching techniques. Next, the semiconductor device is subjected to the earlier mentioned heat treatment at a predetermined temperature for a given time. The temperature is preferably 600° C. or more. The time is predetermined, and may be determined by another process operation. For example, process time can be saved in the fabrication of the semiconductor device if the heat treatment is carried out simultaneously with a corresponding heat treatment of another process step in the fabrication of the semiconductor device. Especially suited for this purpose is the heat treatment during the metallization of the back surface of the device, because this heat treatment takes place at a temperature at which the forming of the contacts functions particularly well.

As described earlier, during the heat treatment, silicon atoms, particularly atoms from the first region 3, migrate through the first metal layer 6 into the second metal layer 8 wherein the first metal layer 6 is preferably chosen so as to have a high diffusion rate for silicon atoms and the second metal layer 8 is preferably chosen so as to have a high combining capacity for silicon atoms. Through such a metal selection, fast and effective sinking of the metal layers and reliable forming of contacts are achieved. In particular, the silicon atoms disappear from the first region 3 causing the first metal layer 6 and the second metal layer 8 to sink in this area to refill this volume. The heat treatment is terminated when the first metal layer 6 has arrived in the second region 2 and all silicon atoms of the first region 3 have combined with the second metal layer 8 in this area. In this area, a contact is formed between the first metal layer 6 and the second region 2. During the heat treatment, a contact was also formed between the first metal layer 6 and the first region 3. Accordingly, the to process of the present invention has the advantage that the deposition of the second metal layer 8 is uncritical, because alignment tolerances do not affect any parameters which are essential for the operation of the semiconductor device.

It should be understood that the embodiment described herein is merely exemplary and that a person skilled in the art may make many variations and modifications to the embodiments utilizing functionally equivalent elements to those described herein. Any and all such variations or modifications as well as others which may become apparent to those skilled in the art, are intended to be included within the scope of the invention as defined by the appended claims.

I claim:

1. A process for making contact to differently doped regions in a semiconductor device which are disposed in a silicon substrate at different depths, said differently doped regions including a first region of a first depth with a first dopant concentration and a first conductivity type, disposed within a second region of a second depth which is greater than said first depth, said second region having a second dopant concentration and a second conductivity type, said process comprising the steps of:

depositing a first metal layer having a high diffusion rate for silicon atoms on said first region;

depositing a second metal layer having a high combining capacity of silicon atoms on a portion of said first metal layer; and heat treating said semiconductor device to cause diffusion of silicon atoms from said first region through said first metal layer into said second metal layer to form a first contact to said first region through said first metal layer and a second contact to said second region through said first metal layer and said second metal layer, wherein said first metal layer engages said second region to form said first contact through said first region.

2. The process as claimed in claim 1, wherein said second dopant concentration of said second region is low relative to said first dopant concentration of said first region.

3. The process as claimed in claim 1, wherein said first conductivity type of said first region is opposite to said second conductivity type of said second region.

4. The process as claimed in claim 1, wherein said first dopant concentration of said first region is high relative to said second dopant concentration of second region.

5. The process as claimed in claim 1, wherein said step of heat treating takes place at a temperature of at least 600° C.

6. The process as claimed in claim 1, wherein said first metal layer is composed of a material which is different from that of said second metal layer.

7. The process as claimed in claim 1, wherein said first metal layer is composed of palladium and said second metal layer is composed of titanium.

8. The process as claimed in claim 1, further comprising the steps of:

depositing a third layer of metal on a back surface of said semiconductor device prior to said step of heat treating, wherein said step of heat treating forms said contacts to said first and second regions while simultaneously forming a contact on said back surface of said semiconductor device.

9. A process for making contact to differently doped regions in a semiconductor device which are disposed in a silicon substrate at different depths, said differently doped regions including a first region of a first depth disposed within a second region of a second depth which is greater than said first depth, said process comprising the steps of:

depositing a first metal layer having a high diffusion rate of silicon atoms on said first region;

depositing a second metal layer having a high combining capacity of silicon atoms on a portion of said first metal layer such that an uncovered area of said first metal layer exists; and heat treating said semiconductor device to cause diffusion of silicon atoms from said first region through said first metal layer into said second metal layer to form a contact to said second region through said first metal layer and said second metal layer, said first metal layer engaging said second region through said first region by diffusion of silicon atoms from said first region through said first metal layer into said second metal layer.

10. The process as claimed in claim 9, wherein said step of heat treating forms a second contact to said first region through said first metal layer at said uncovered area.

11. The process as claimed in claim 9, wherein said step of heat treating forms said contact to said second region by causing said portion of said first metal layer covered by said second metal layer to extend down through said first region into said second region.

12. The process as claimed in claim 9, wherein said first region has a first dopant concentration and a first conductivity type and said second region has a second dopant concentration and a second conductivity type.

13. The process as claimed in claim 12, wherein second dopant concentration of said second region is low relative to said first dopant concentration of said first region and said first conductivity type of said first region is opposite to said second conductivity type of said second region.

14. The process according to claim 1, wherein said first contact to said first region through said first metal layer is at an area not covered by said second metal layer.

15. The process according to claim 13, wherein said semiconductor device is a DMOS transistor.

\* \* \* \* \*